United States Patent [19]

Krausse, III

[11] Patent Number: 4,891,686
[45] Date of Patent: Jan. 2, 1990

[54] SEMICONDUCTOR PACKAGING WITH GROUND PLANE CONDUCTOR ARRANGEMENT

[75] Inventor: George J. Krausse, III, Fort Collins, Colo.

[73] Assignee: Directed Energy, Inc., Fort Collins, Colo.

[21] Appl. No.: 179,489

[22] Filed: Apr. 8, 1988

[51] Int. Cl.[4] .................... H01L 23/48; H01L 29/44
[52] U.S. Cl. ........................................ 357/68; 357/65; 357/81; 357/22; 357/79; 357/74; 357/80; 333/12; 333/246; 361/400
[58] Field of Search ............... 357/68, 65, 81, 22, 357/79, 74, 80; 333/12, 246; 361/400

[56] References Cited

U.S. PATENT DOCUMENTS

| | | | |
|---|---|---|---|
| 3,886,505 | 5/1975 | Jacobson | 357/74 |
| 3,893,159 | 7/1975 | Martin | 357/75 |
| 3,911,327 | 10/1975 | Murani et al. | 357/79 |
| 3,959,577 | 5/1976 | Frink | 357/79 |
| 3,969,752 | 7/1976 | Martin et al. | 357/68 |
| 4,042,952 | 8/1977 | Kraybill | 357/68 |
| 4,159,483 | 6/1979 | Bettin | 357/79 |
| 4,168,507 | 9/1979 | Yester, Jr. | 357/68 |
| 4,200,880 | 4/1980 | Frey | 357/68 |
| 4,460,880 | 7/1984 | Turner | 333/238 |
| 4,489,121 | 2/1985 | Breedis et al. | 357/74 |
| 4,600,907 | 7/1986 | Grellman et al. | 333/260 |
| 4,605,915 | 8/1986 | Marshall et al. | 333/238 |
| 4,677,458 | 6/1987 | Morris | 357/80 |

Primary Examiner—Andrew J. James
Assistant Examiner—Jerome Jackson, Jr.
Attorney, Agent, or Firm—Dean P. Edmundson

[57] ABSTRACT

Packaging techniques are described which provide electrical, thermal, and mechanical advantages. A low-profile semiconductor package is described in which the leads are flat and are present in the same plane. The leads are arranged and positioned in order to eliminate inductance. A semiconductor die is secured to a ceramic substrate, and a plurality of bond wires are secured between the pads on the die and the leads of the package.

15 Claims, 5 Drawing Sheets

SEMICONDUCTOR PACKAGING WITH GROUND PLANE CONDUCTOR ARRANGEMENT

FIELD OF THE INVENTION

This invention relates to high power electronic component packaging techniques. In another aspect this invention relates to packaging of metal oxide semiconductor field effect transistors (MOSFET) used as power switching devices in power conversion.

BACKGROUND OF THE INVENTION

Electronic packaging is the method whereby a discrete semiconductor is encased or encapsulated to protect it from environmental contamination (e.g., moisture and particulates), and is connected to the external circuit. Packages combine various materials chosen for their electrical, mechanical, or thermal properties, which are then assembled and bonded by standard techniques. The optimum packaging for a particular semiconductor device is determined by the desired performance characteristics and reliability requirements.

In a typical package a semiconductor die is attached via solder or conductive epoxy to a substrate. The die pads are connected to external leads by wire bonds. The entire circuit is then covered with a ceramic or metal lid or encapsulated in plastic or epoxy, thus forming one of several configurations.

The perfect electronic package might be described as one which is "transparent" to the circuit; that is, the package in no way alters the signal or waveform of energy either entering or leaving the semiconductor. Thus, any changes to the signal or waveform would be due solely to the action of the semiconductor.

However, the perfect package does not exist due to inductive, capacitive, and resistive properties inherent to the packaging materials themselves, and due to the physical arrangement or geometry of the materials in relation to one another in the assembled package. These deleterious phenomena are variously described as strays and parasitics. They are not critical in most low power, low frequency semiconductor applications, but at high power (1 KW) and higher frequencies (200 KHz) they pose serious obstacles to device performance.

With recent advances in the understanding of solid state physics and improved semiconductor fabrication techniques, manufacturers now offer devices inherently capable of high power, high frequency operation. These offer the promise of improved reliability, efficiency, and performance in a wide range of important high power technologies now based on antiquated tube designs, such as lasers, telecommunications, radar/sonar, radio transmitters and airborne switch mode power conversion. However, the potential contribution of the new devices to these industries has been impaired by the lag in advances in packaging technology. This fact is widely acknowledged by experts in the solid state power electronics industry.

High frequency and high power each present unique set of packaging design problems. Due to the inherent inductance of a conductor, as the current changes at high frequency the concomitant changes in magnetic flux creates a reactive term which resists the current flow. High power is the product of high voltages and high currents, thus the packaging materials are subjected to severe electrical and thermal stresses.

When high frequency and high power are combined, the problems multiply by orders of magnitude. Parasitic packaging elements, which are inconsequential at low power or low frequency, can severely degrade the performance of the semiconductor operating at high power and high frequency. Energy loss due to inductance is directly proportional to the current, so as the current rises, large B-fields emanate from the conductor which store energy. To further compound these reactive terms, as the current flows from the external circuit to the semiconductor itself, it will encounter changing impedances through various packaging materials and physical geometries.

Each segment has a characteristic impedance, and if there are abrupt changes from one segment to another, a major discontinuity results which causes an even larger reactive term. Also, as the frequency increases, if the device is at significant power, due to internal resistive and reactive terms, it will begin to dissipate heat that can destroy it if the package cannot remove the heat rapidly enough. As waveforms interact with each of these terms, they are gradually degraded.

A number of conventional packages exist for high power, low frequency semiconductors and for low power, high frequency semiconductors.

For low frequency, high power applications, two basic types of packaging have dominated since the 1960s: the TO-3, widely used in military applications, and the TO-220 style packages. The TO-3 consists of a cylindrical metal case on top of a diamond-shaped metallic substrate of steel, nickel plated copper, or a kovar alloy, with two rigid round leads emerging from the bottom. The TO-3 style device is held by two screws to a heat sink. The TO-220 style package is a flat, rectangular shape with a metal tab lead for heat dissipation on one end and three copper leads for electrical connections on the other. It is attached by a single screw to a heat sink. Most other prior art packaging configurations are variations on these two.

Neither the TO-3 nor the TO-220 style packages are suitable for high frequency operation. The round, rigid kovar leads and single, heavy gauge bond wire attachments exhibit severe inductive terms that prohibit fast switching. Often an additional inductive term is added as the leads pass through the metal base. Furthermore, their numerous thermal boundaries prevent rapid efficient heat dissipation. Because the coefficient of expansion of these metals is poorly matched to silicon, it is not uncommon for the metal to expand sufficiently to crack the semiconductor.

The primary packaging technique utilized for low power, high frequency semiconductor devices is the use of an RF or microwave "stripline" design characterized by one or more flat leads. Flat leads are used to mate with the broad stripline terminating on the circuit board and for another important reason. The inductance of a conductive path is proportional to its enclosed volume. By flattening the lead and placing it near the return path or ground plane, the inductance is reduced. Also, at high frequencies, current tends to migrate to the surface of the conductor, a phenomenon known as the skin effect; thus a broader lead can carry more current at higher frequencies. The leads are usually copper or a copper-kovar alloy. These devices are typically much smaller than high power packages. The low power semiconductors are very small so only moderate heat-sinking is required.

The problems noted above are observed in many types of semiconductor packages. They are particularly pronounced in regards to pulsed power applications.

Pulsed power is a method of storing energy over a long period of time and releasing that energy in a very short period of time at a very high power level. An increasing number of tasks rapidly emerging in the scientific community are demonstrating the need to generate bursts of power at speeds approaching the limits of current pulsed-power technology.

The generation of energetic pulses has previously depended strongly on non-solid-state switching technology when speed and voltage requirements are less than a few nanoseconds and greater than a few hundred volts, respectively. Switching requirements of greater than 10 kW in less than 3 nS, for example, limit the circuit designer to only a few technologies, none of them particularly simple or inexpensive. The addition of high repetition-rate requirements compounds the problem, and will generally limit the designer to a vacuum tube approach if the repetition rate and/or rise time are outside available thyratron capabilities.

The emergence of power MOS field-effective transistors (FET) over the past few years has created a revolution in the design of mass-produced circuits such as switching power supplies. Circuit designers have been able to use them to achieve switching speeds of 20 to 50 nS in power supply applications, which is a significant improvement over conventional bipolar transistors.

The key element in a pulse generator circuit is the switch which provides the fast rise-time output. Several technologies have been available for fast, high-voltage applications in the past. However, for work under 5 nS, the choices are somewhat limited. Gas switches (spark gaps) and krytrons, for example, have been popular for their high performance and low cost. Their use is often precluded, however, by high jitter and poor operational lifetime. More recently, the bulk-semiconductor photoconductive (Auston) switch has emerged as an effective high-voltage switch. This device relies on the photon-induced generation of carriers within a bulk-semiconductor material. Typically, the Auston switch requires a complex pulsed laser system for turn-on. Some other approaches rely on rise-time improvement using various magnetic techniques, but waveform is difficult to control with these methods and an active pulse generator must be provided. Avalanche-mode transistors continue to be used and indeed present an attractive solution to many engineering problems. They are, however, power limited and often exhibit reliability problems. Such difficulties are compounded when multiple devices are used to attempt to circumvent the power issue. For completeness, the hydrogen thyratron is mentioned, but it is limited to a rise time of around 3 nS. Most thyratrons are no faster than 15 nS.

This often leaves the vacuum tube as the only viable switching element available for rise-time requirements under 3 nS and greater than 10 kW and for circuits with repetition-rate conditions requiring low jitter. Such specifications would describe a device which could function as a Pockels cell driver, for instance. Pockels cells are high speed electro-optic devices used as shutters in laser systems. For such a speed requirement, component selection is generally limited to microwave planar triodes such as the Varian/Eimac Y-690. High speed circuits used with these devices tend to be complex because the circuit-induced multiplication of the input capacitance of the triode (known as the Miller Effect) limits power gain. The vacuum-tube current for pulse applications also is limited to around 12A/cm$^2$ of cathode area. Higher currents are possible but tube lifetime may be degraded.

In the past few years, power MOS has solved many power circuit problems and created a new generation of high-frequency switching power supplies which are small and lightweight. This improvement in power-supply performance still does not satisfy the specialized needs of high voltage pulse generators requiring output voltages of up to 10 kV and with rise-time requirements sometimes below 1 nS. Such pulsers find use in lasers and other optical systems, radio frequency modulators, other sensor drivers, and a variety of miscellaneous tasks continually emerging in the scientific community.

All power MOS is implemented as an array of thousands of transistor cells on each MOSFET chip; these cells are approximately 1 to 2 square mils in area. The switching speed inherent in any given cell is extremely fast, typically on the order of 200 pS. However, overall device switching speed of packaged chips is significantly slower.

Hybrid high power electronic components are required for a wide range of circuit designs, especially in power conversion, high frequency RF, and microwave applications. A hybrid power circuit consists of a semiconductor die attached via solder or conductive epoxy to a substrate. The die pads are connected to external leads by wire bonds. The entire microcircuit is then encapsulated, thus forming one of several packaging and interconnect configurations which are available to interface the hybrid circuit to the external circuit. Typically, these packages are either plastic or metal.

There has not heretofore been provided packaging techniques which enable metal oxide semiconductor devices to be used in very fast switching applications high power pulse generators.

SUMMARY OF THE PRESENT INVENTION

The packaging techniques of the present invention are designed to optimize the electrical, thermal, and mechanical performance of high power, high frequency semiconductor components. For purposes of the following discussion, the techniques of the invention are discussed in connection with the packaging of power MOSFET transistors, but these techniques are also applicable to other power semiconductor devices including, but not limited to, bipolar transistors, laser diodes, and Impatt diodes. For example, the packaging techniques of this invention enable power semiconductor devices to be used in the production of high power pulse generators with switching times approaching 1 nS.

The packaging techniques of the present invention have several objectives, including:

(1) To radically reduce package inductance, which is accomplished by controlling the impedance of the circuit from the external circuit to the contacts in and out of the semiconductor, and the implementation of electromagnetic symmetry that either: (a) cancels the B-fields, or (b) confines them to a very small area.

(2) To insure rapid heat dissipation: (a) by direct die attach to beryllium oxide, a material that is an excellent thermal conductor, an insulator, and which shares a coefficient of thermal expansion similar to silicon, and (b) by minimizing the thermal barriers through which heat produced by the semiconductor must pass to the heat sink.

(3) To allow three dimensional movement of the device for thermal heat cycling required for high power, high frequency operation, while insuring the integrity of the contact of the package to the heat sink, and to allow surface mount compatibility. This is achieved by a novel lead configuration and termination that minimizes the mechanical stress on the package seal and provides compliance for X, Y, and Z movement.

The techniques of the present invention are applicable to a wide variety of semiconductor devices, and especially to semiconductor power devices.

Fast power MOSFET devices as described herein are useful in a variety of applications such as low-power lasers, marine communications, particle accelerators, cancer treatment, military equipment, nuclear testing, military equipment, nuclear testing, and avionics (both civilian and military).

Other advantages of the packaging concepts of the invention will be apparent from the following detailed description and the appended drawings.

BRIEF DESCRIPTION OF THE DRAWINGS

The invention is described in more detail hereinafter with reference to the accompanying drawings, wherein like reference characters refer to the same parts throughout the several views and in which.

DETAILED DESCRIPTION OF THE INVENTION

Figure 1A:
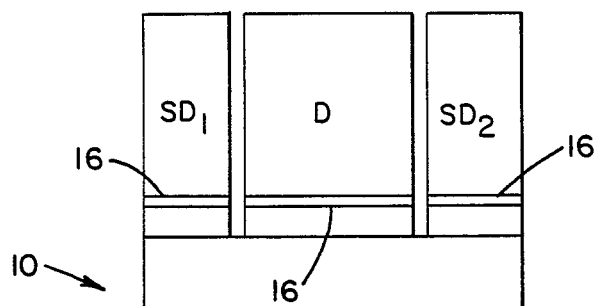
FIGS. 1A and 1B are top and side elevational views of one embodiment of semiconductor packaging of the invention.

During the development of the present invention it was determined that the major limitation of prior MOSFET devices in high power, high frequency applications is the parasitic inductances of the leads and the packages themselves. Typical inductances in the TO-3 type and TO-220 type packages are on the order of 10 nH, a substance impediment to fast switching. In high frequency circuits the TO-3 package has severe inductance problems aggravated by the magnetic properties of the kovar alloy used in the leads, as well as the geometry or physical proximity of the leads themselves. The TO-220 package has similar geometry induced inductance problems.

Another major limitation associated with the use of TO-3 and TO-220 packages for high power, fast switching circuits are the poor thermal properties of the packages. Internal losses in the form of heat must be removed by conduction from the semiconductor while maintaining electrical isolation of the device. The higher the power at which the device is operated, the higher the power loss. If the heat is not removed efficiently, the device fails. In a TO-3 package the semiconductor die is soldered to a copper case which must then be electrically insulated from the heat sink by a mica washer with thermal compound on both sides. These multiple thermal boundaries severely impede the thermal performance. Thermal conductivity is further degraded by the TO-3 package because the device is attached to the heat sink at two points. Thermal expansion can cause the case to bow and cause thermal voiding or mechanical damage to the chip itself. Therefore, the lack of ability to remove heat in these packages has restricted the usefulness of semiconductor technologies in high power circuits.

A third major limitation of prior art packaging for power devices is that it is not compatible with surface mount technology, a rapidly growing technique for circuit design in the engineering profession, especially for military and aerospace applications.

The packaging techniques described herein address the foregoing mechanical, thermal and electrical problems and other problems of the prior art. The packaging concepts of the invention are described herein with reference to a power switching device utilized in power conversion or pulsed power application, the device being metal oxide semiconductor field effect transistor (MOSFET). The packaging concepts of this invention, however, are also useful in optimizing the performance of any solid state device.

The major impediment to fast switching in existing packages utilizing MOSFET technology is the stray inductance created by the packaging itself. Although multiple bond wires have been implemented in previous technology to reduce the inductance, this is not sufficient in itself for high speed operations.

A key electrical feature of the present invention is electromagnetic symmetry. The geometry of conventional packaging causes tray inductance which limits the charge and discharge of the input capacitance, hence limiting on-off time, and is also responsible for a $-L\, di/dt$ term on the source lead. Stray inductance is eliminated in the circuitry of the present invention by means of electromagnetic symmetry. In an ideal transmission line, inductive and capacitive terms are equal and cancel so that only impedance remains.

As shown in FIG. 1A, when viewed from the top, a package 10 of the invention is symmetrical. However, not only is it physically symmetrical, it is also electrically symmetrical. Other prior art packages may be physically symmetrical in some circumstances, but none of them are electrically symmetrical.

Prior art MOSFET packages have only three, or at most four, leads: one for the gate, one or two for the drain, and one or two for the source. Referring again to the package shown in FIG. 1A, two source leads or conductors (SG1, SG2) are reserved for the gate drive return currents only and two source leads or conductors (SD1, SD2) are reserved for the drain drive currents only. The source leads on both the input and output sections are equal in size to one another and equidistant from the gate (G) and drain (D) leads, respectively.

Figure 3:
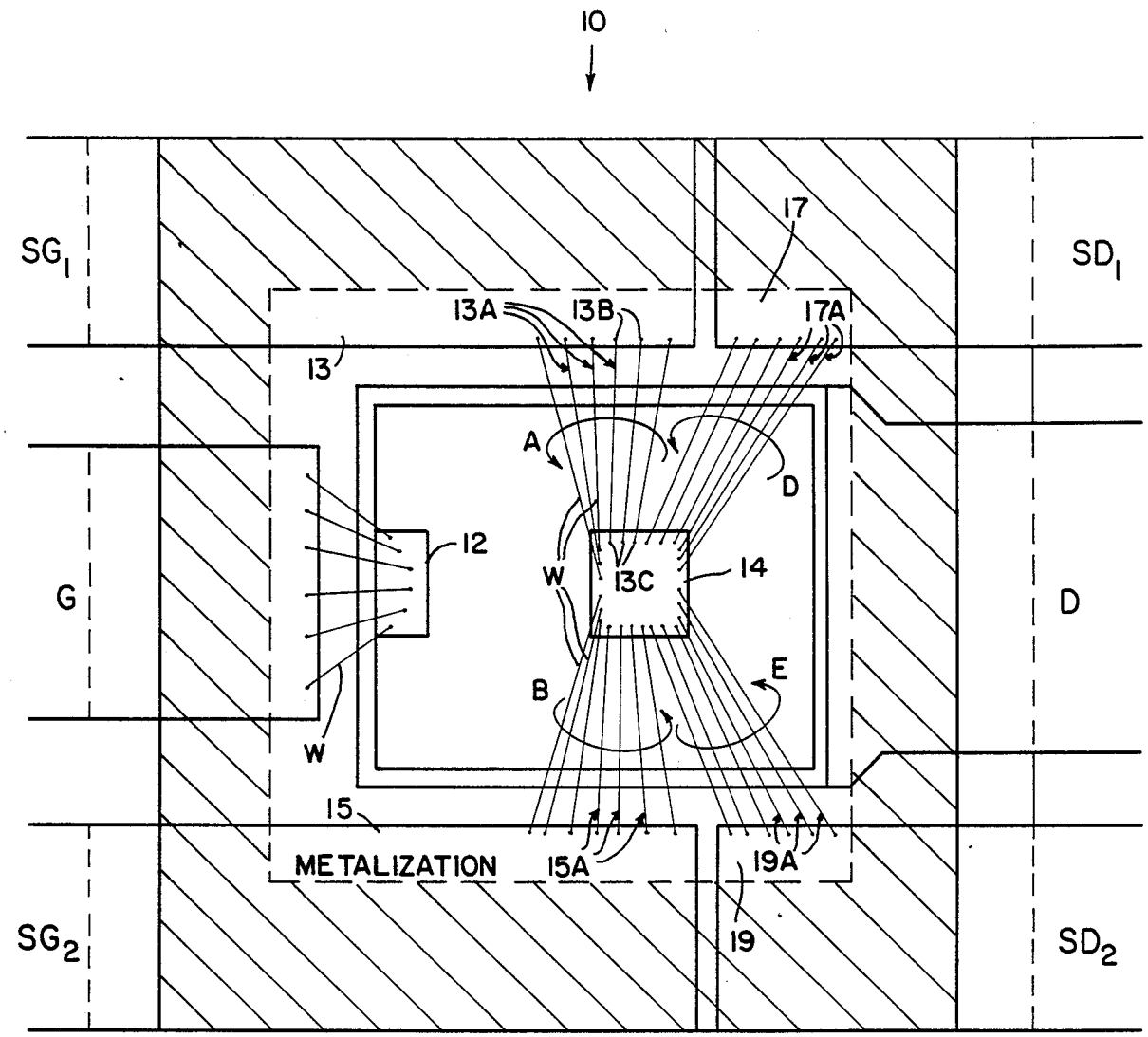
FIG. 3 is a top view of a semiconductor package illustrating the electromagnetic symmetry used in the present invention.

As shown in FIG. 3, the symmetry of the multi-lead configuration is invoked from the external leads to the internal metallization, then to the wires W terminating on the pads 12 and 14. The number of leads, their physical configuration, and the geometry of the bond wire attachments are very important in the present invention, as explained in more detail hereafter.

Figure 2:
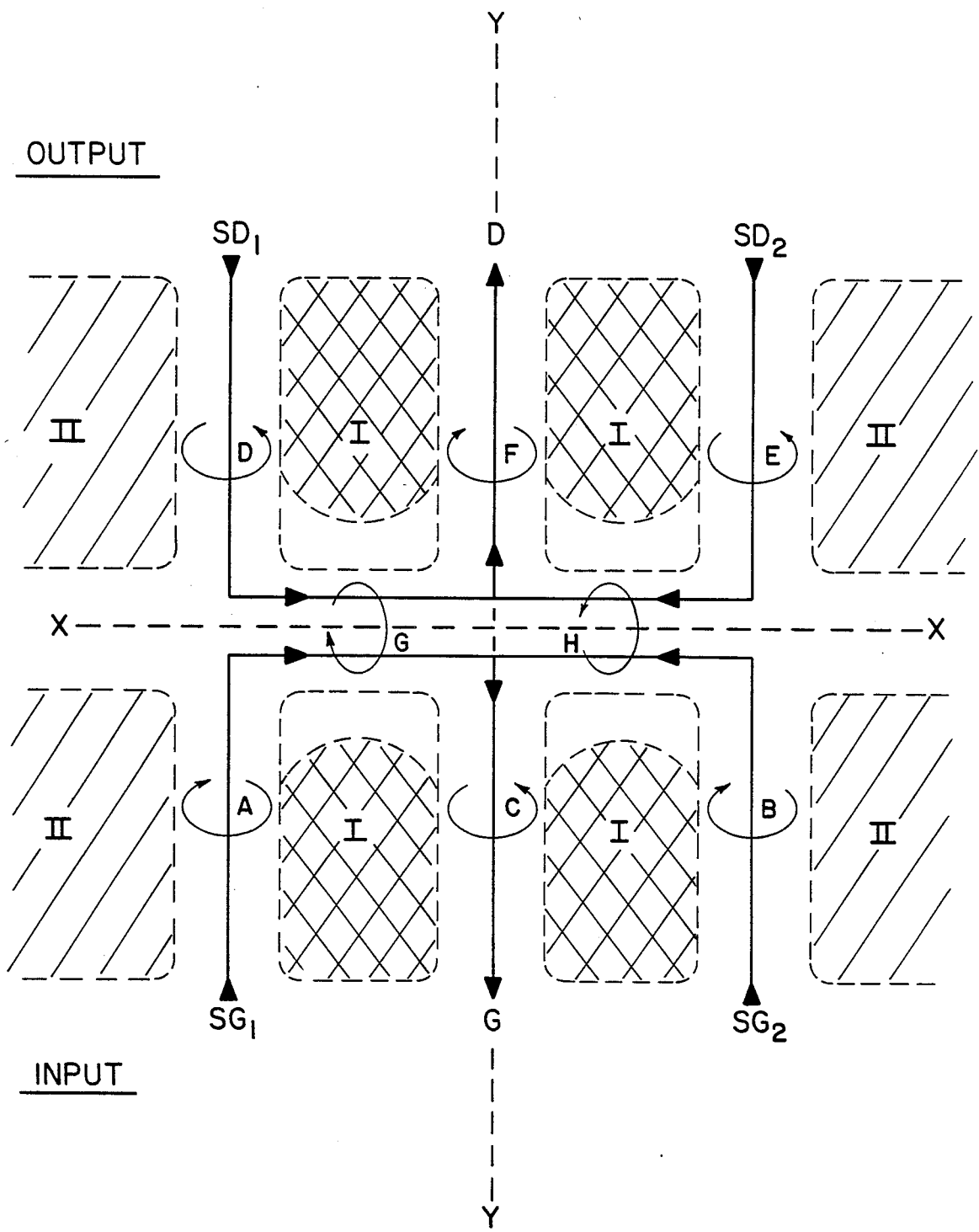
FIG. 2 illustrates the techniques of the present invention being utilized in a MOSFET package.

FIG. 2 is a functional diagram of the invention when in a MOSFET embodiment. Bilateral symmetry is exhibited on both the X and Y axis. As the MOSFET is turned on and off, the arrows denote the direction of the current flow on leads SG1, SG2, and G in the input section, and, likewise, the direction of currents on leads SD1, SD2 and D in the output section. With the flow of current, magnetic B-fields are instantaneously self-induced in all legs of the circuit. The B-fields exist as concentric ellipses with their plane orthogonal to the current paths. If these B-fields were visible and one were looking down the conductor with the current moving away from the observer, the B-fields would appear as concentric ellipses rotating with a counter-clockwise vector. The direction of the B-field vectors which are induced by the current flowing in the leads in the package are indicated by circular arrows A, B and C on the input section, and D, E and F on the output section.

Note that current in G flows in opposition to the currents in SG1 and SG2. Likewise, the current in D flows in opposition to the currents in SD1 and SD2. As a result of the opposite currents, the vectors of the B-fields created by these currents are also in opposition. On the input section, vectors A and B are opposite in direction to C. Also on the output section, vectors D and E rotate in an opposite direction to F. Because both the input and output sections are each discrete parallel circuits, the currents in the source leads will always be one-half the currents in the gate and drain respectively. Stated algebraically, $I(SG1)+I(SG2)=I(G)$ and $I(SD1)+I(SD2)=I(D)$; therefore, the magnitude of the B-field vectors associated with these currents share the same relationship. However, due to the opposing direction of currents, the vectors of the B-fields are in opposition and thus are mutually canceling. In general terms, across both axes of the package, due to the electromagnetic symmetry, the sum of the strength of the B-fields is the sum of the opposing vectors, or as expressed algebraically, $A+B+(-C)=0$ and $D+E(-F)=0$. However, the actual coupling and interaction of the B-fields is more complex than this simplistic representation.

Referring again to FIG. 2, the shaded areas designated by Roman numerals I and II represent the relative areas of the B-fields that are induced when currents are present in the circuit. The volume and intensity of the fields expand and contract directly with the rise and fall of the current. The fields that exist in the areas between the leads denoted by I are more intense than areas outside the leads, denoted by II. For example, as B-fields couple in the plane between SG1 and G, the vectors are momentarily in parallel and thereby strengthen the field. This phenomena is repeated between all the leads. Though these fields are intense, they are very small because they are confined, by design, to the area between the leads.

The pattern of B-field cancellation in the package approximates the following: vector C cancels both II(input) areas and vector F cancels both II (output) areas. Vector B cancels I(input) between SG1 and G, and vector A cancels I(input) between SG2 and G. Likewise, vector D reduces I(output) between SD2 and D and vector E reduces I(output) between SD1 and D. Vectors G and H of the converging source leads combine to further reduce all four I areas. As shown in FIG. 3, at the source pad where the source leads are attached, vector A cancels vector E and vector B cancels vector D.

In order for the magnetic fields to remain in perfect counterbalance, the impedance of the input and output sections must be carefully controlled and be identical. This is accomplished by matching the impedance characteristics along the current path from the external circuit to the semiconductor. All the leads are gold plated dead soft copper. The leads are very broad in order to accommodate the currents flowing along the surfaces that result from operating at high frequency and high power, but shallow in depth to minimize the area to minimize the dielectric space of the facing surfaces between the leads, thereby reducing capacitance. The leads are also spaced at sufficient distance to provide an adequate voltage holdoff to prevent arcing. The parallel leads assure that the capacitance and inductance is held constant to the entry threshold of the package.

Once the current passes from the lead through the package metallization, it must be funneled into the focal point of the semiconductor gate. In order to prevent an abrupt impedance change and more closely approximate a current sheet, the multiple bond wires are attached to the widest possible width along the metallization pads 13, 15, 17, and 19, as shown in FIG. 3, in such a way that they have a flat, planar relationship, like a ribbon, and arc in a cone shape to the gate. This allows the bond wires to emulate the flat incoming leads and metallizations, and minimize the skin effect, while at the same time smoothing the impedance change leading to the semiconductor. The identical multiple bond wire attachment is used for the gate lead and all four source leads. In FIG. 3 the four sets of multiple bond wires are identified as 13A, 15A, 17A, and 19A, respectively, and may referred to as first, second, third and fourth sets, respectively, of multiple bond wires. A first end (e.g. 13B) of each bond wire is connected to a ground plane conductor metallization pad (e.g. 13) and the second end (e.g. 13C) of each such wire is connected to the connection pad 14 on the source area. The second, third and fourth sets of bond wires 15A, 17A and 19A are connected similarly in the manner shown in FIG. 3.

Figure 1B:
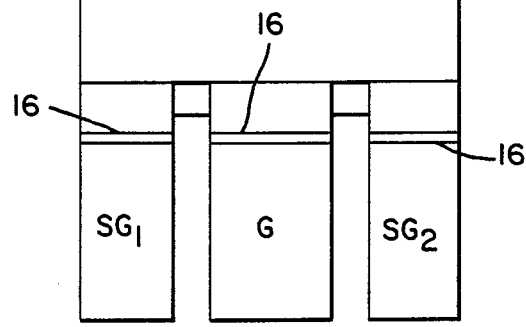

FIGS. 1A and 1B also illustrate other features of the packaging techniques of the present invention. Each of the leads are thin and wide conductive strips. Each lead has been provided with a stress relief bend 16, as illustrated.

The stress relief bend in each lead enables the outer end of the lead to move in X, Y, or Z directions without putting stress on the device 10. This feature allows the device to expand and contract freely in response to thermal loading, without possible damage to the leads or the device.

The radius of the stress relief bend should be ten or more times the thickness of the lead. Although two types of stress relief bends are illustrated in the drawings, other types could also be used.

Figure 4A:
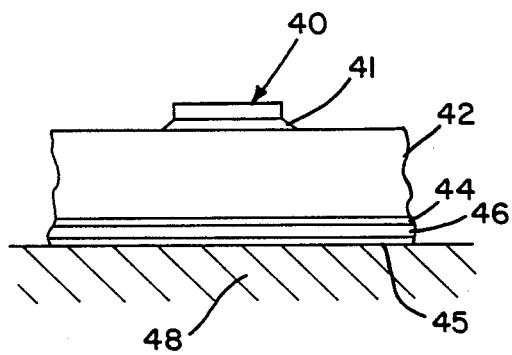
FIG. 4A is a side elevational view illustrating a prior art packaging concept.

FIG. 4A is a side elevational view illustrating a prior art packaging concept in a power MOSFET device. The device 40 is soldered to a copper case 42 with solder 41. The copper case is then coated with a layer of a conventional thermal compound layer 44 and then placed on top of a mica washer 46. A thermal compound layer 45 is the last material boundary from the die to the heat sink 48. This entire assembly is then put in compression. This multiplicity of thermal barriers greatly reduces the power dissipating ability of the die 40.

Figure 4B:
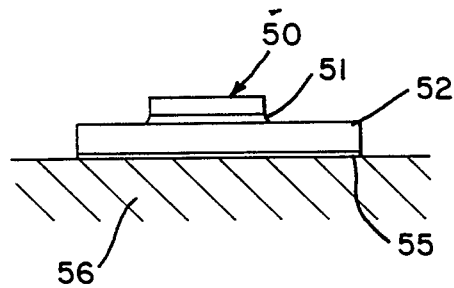
FIG. 4B is a side elevational view illustrating a packaging concept of the present invention.

FIG. 4B is a side elevational view of a packaging concept of the present invention. The power MOSFET device 50 is soldered to a beryllium oxide substrate 52 using solder 51. This substrate has a coefficient of expansion of 8, which is very close to that of gallium arsenide at 6.8 and silicon at 5.

The beryllium oxide substrate typically has a thickness in the range of about 0.015 to 0.060 inch, depending upon the termal and mechanical requirements. Another substrate which could be used in place of BeO is diamond.

Figure 5:
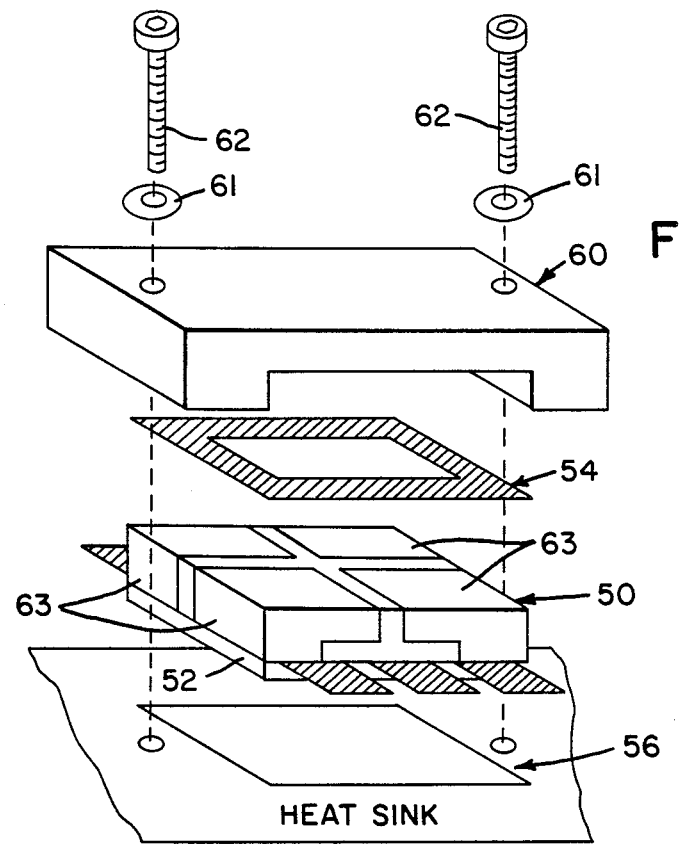
FIG. 5 is an exploded view illustrating a packaging concept of the present invention.
Figure 6A:
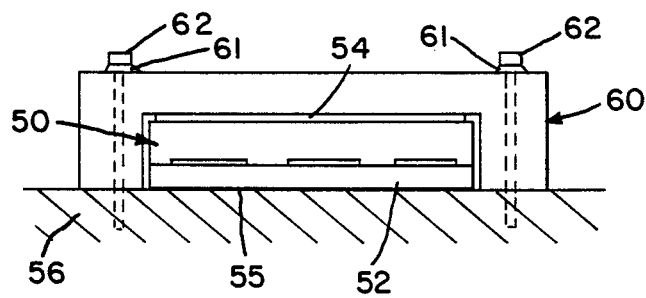
FIG. 6A is a side elevational view of the packaging concept shown in FIG. 5.

A clamp system then secures the power device to the heat sink 56. This is illustrated in FIGS. 5 and 6A. This technique provides improved thermal properties by reason of (1) reduced number of thermal boundaries, (2) reduced length of thermal path, and (3) improved thermal characteristics of the materials used in the package.

The mechanical design of the invention allows the device to "float," that is, expand and contract freely in the X, Y, and Z axis in response to thermal loading.

The bottom surface of the package of the invention is polished to ±0.5 mil per inch flatness to insure the integrity of the thermal contact. This along with the novel clamping system 60 shown in FIGS. 5 and 6A maintains good thermal contact between the package 50 and the heat sink 56. A thermal compound 55 is positioned between the heat sink and the substrate 52.

The elastic polymer 54 interface between the package and the clamp allow for irregularities. The belleville washers 61 on threaded screws 62 allow for mechanical system compliance.

The belleville washers act as a spring to insure gross or macro compliance in the Z direction. The flex of the ceramic package itself acts as a micro spring. No prior art high power packaging technique permits stress relief on all three axes while maintaining superior heat transfer properties.

Unlike other packages, as heat increases in the package of this invention there is pressure on the package to maintain the desirable thermal contact with the heat sink. The clamping system described and illustrated herein, by allowing the package to expand and contract, provides favorable heat transfer characteristics. By attaching the semiconductor die directly to the ceramic substrate, the package of the invention eliminates many thermal boundaries present in prior art devices. The result is a RJ(HS) of 0.5° C. per watt, an improvement of greater than a factor of 3 over previous technologies.

Figure 6B:
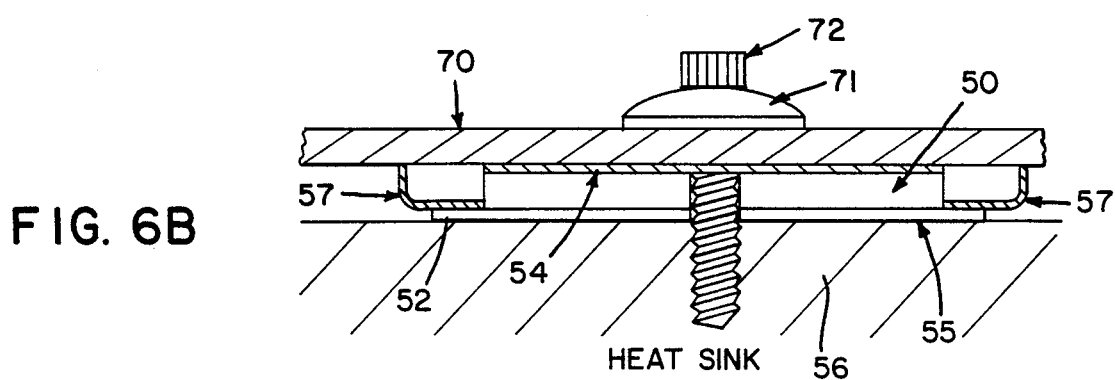
FIG. 6B is an end view, partially cut-away, of the package shown in FIG. 5 secured to a printed circuit board and a heat sink.
Figure 8A:
FIGS. 8A through 8E illustrate other types of semiconductor devices which may be packaged using the techniques of the invention.
Figure 8B:
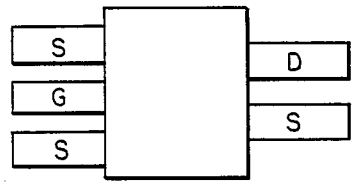
Figure 8C:
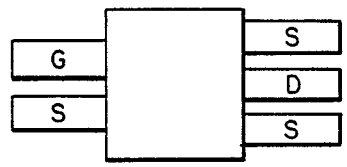
Figure 8D:
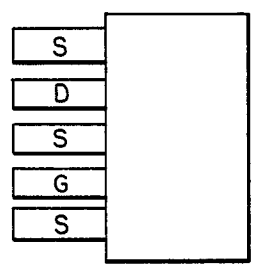
Figure 8E:
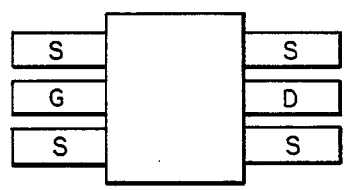

As explained above, another feature of the packaging of this invention is that stress relief bends (e.g., as shown in FIG. 6B) are provided in the leads of the package. The leads are preferably made of dead soft copper. The leads can be plated with gold, if desired. Alternatively, the leads could be composed of other non-ferrous materials (e.g., gold or aluminum, although aluminum is more difficult to bond).

The bends insure that the expansion and contraction of the leads during thermal cycling are not transferred to the lead attachments. Thus, the package can expand and contract while the clamping system maintains good thermal contact between the package and the heat sink.

Another variation of the invention is illustrated in FIG. 6B where device 50 is secured to heat sink 56 by means of threaded screw 72 and belleville washer 71. The screw 72 passes through printed circuit board 70 in a manner such that device 50 is clamped between printed circuit board 70 and heat sink 56. The leads 57 of the device include stress relief bends and are secured at their outer ends to appropriate circuitry on the board 70. Typically there are two screws 72.

Figure 7:
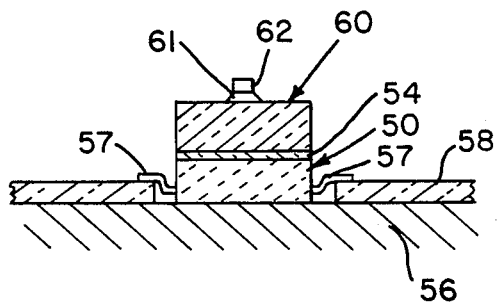
FIG. 7 is a cross-sectional view illustrating a semiconductor device of the invention on a printed circuit board.

FIG. 7 illustrates another embodiment of the invention in which device 50 is clamped to heat sink 56 by means of clamp 60 and screw 62. The leads 57 include stress relief bends as illustrated, and they are secure at their outer ends to appropriate circuitry on printed circuit board 58.

FIGS. 8A through 8E are top views of various embodiments of semiconductor devices which are useful in the present invention. In each figure the leads of the device are labelled G for gate, S for source, and D for drain.

In each device there are at least four leads, either on the same edge of the device or on opposite side edges of the device. There are at least two leads on an edge if there are any leads there at all. This is to maintain electromagnetic symmetry in the device. In other words, the inductive terms of the individual leads reduce or completely cancel one another to thereby reduce and eliminate overall package inductance. Typically there are about 4–6 leads per device, although there could be more, if necessary.

The arrangement illustrated in the drawings where there are two or more parallel leads in the same plane on one side of a device, but with opposing current flows, and where leads are present on opposite side edges of the device, is very advantageous in that the overall circuit exhibits bilateral symmetry of the currents on both the X and Y axes.

The leads are thin, planar, conductive materials which are many times wider than they are thick. For example, it is preferred that the leads be at least ten times wider than their thickness. The thickness of each lead may be, for example, about 0.01 inch. The spacing between side edges of adjacent leads should be in the range of about 0.01–0.1 inch. This close spacing reduces the space between adjacent leads and therefore reduces the volume of the B-field as previously described.

Also, the semiconductor device is preferably secured to the package by multiple bond wires, as illustrated in FIG. 3, whether as a finite or continuous element, in a flat ribbon-like arrangement to approximate a current sheet. Multiple leads are attached to the same pad in a symmetric pattern of opposing B-field vectors to reduce inductance at the focal point of the die attachment.

The packaging techniques of the invention also allow for the use of a Faraday shield 63 on the package cover (and it could also be included on the bottom of the substrate 52) to further confine the B-field, as illustrated in FIG. 5.

The wide, flat, planar leads used in the packages of this invention permit the device to accommodate very high currents at high frequencies and provide a low impedance path for charge and discharge of input capacitance.

When the invention is in operation, symmetrical physical geometry forces the gate drive image currents to flow through the device in parallel branches of equal magnitude, so that the magnetic vectors form an elliptical cylinder with its axis in the center of the gate lead.

The net effect is that the magnetic fields' vectors are combined and canceled. Without magnetic fields, there can be no energy loss due to inductance. Thus insertion inductance is eliminated or greatly reduced.

As will be apparent to those skilled in the art, once the concept to electro-magnetic symmetry is understood in the packaging of power semiconductor devices, a wide variety of semiconductor devices suggest themselves for similar packaging.

The techniques of the present invention allow direct bonding of a semiconductor package to a wide variety of heat sinks in a simple and effective manner. The semiconductor package also enables mounting to desired substrates using surface mount techniques.

Manufacturing of the semiconductor package of the invention is simplified because all of the leads are present in a single plane. The semiconductor package has a low profile, is light-weight, and is compatible with microwave circuitry.

The techniques of the invention can also be used in hybrid packages where there are several semiconductor devices present.

Other variants are possible without departing from the scope of the present invention.

What is claimed is:

1. A high power MOSFET semiconductor package comprising:
    (a) a ceramic substrate having a planar upper surface and opposite side edges;
    (b) a MOSFET semiconductor die secured to said upper surface of said ceramic substrate; said die including gate, source and drain areas and having connection pads on said gate, source and drain areas;
    (c) a gate signal carrying conductor electrically connected to said connection pad on said gate area;
    (d) a drain signal carrying conductor electrically connected to said connection pad on said drain area;
    (e) ground plane conductors disposed one each side, and separated from, and parallel to each of said signal carrying conductors; wherein each said ground plane conductor is electrically connected to said connection pad on said source area;
    wherein said ground plane conductors are disposed in the same plane as said signal carrying conductors.

2. A semiconductor package in accordance with claim 1, wherein said ceramic substrate comprises beryllium oxide.

3. A semiconductor package in accordance with claim 1, wherein there are two of said ground plane conductors which project from one side edge of said substrate and another two of said ground plane conductors project from the opposite side edge of said substrate.

4. A semiconductor package in accordance with claim 1, wherein each said conductor includes a stress relief bend.

5. A semiconductor package in accordance with claim 1, wherein each said conductor is copper.

6. A semiconductor package in accordance with claim 1, wherein each said ground plane conductor includes a metalization pad disposed on said ceramic substrate.

7. A semiconductor package in accordance with claim 6, wherein said gate signal carrying conductor and said drain signal carrying conductor project outwardly from opposite side edges of said substrate; wherein there are four said ground plane conductors; wherein two of said ground plane conductors are disposed on opposite sides of and spaced from said gate signal carrying conductor an equal distance, and wherein the other two of said ground plane conductors are disposed on opposite sides of and spaced from said drain signal carrying conductor an equal distance.

8. A semiconductor package in accordance with claim 1, wherein said gate signal carrying conductor and said drain signal carrying conductor comprise planar conductive strips; wherein said gate signal carrying conductor and said drain signal carrying conductor project outwardly from opposite side edges of said substrate in the same plane; wherein there are four said ground plane conductors; wherein two of said ground plane conductors are disposed on opposite sides of and spaced from said gate signal carrying conductor an equal distance, and wherein the other two of said ground plane conductors are disposed on opposite sides of and spaced from said drain signal carrying conductor an equal distance.

9. A semiconductor package in accordance with claim 8, wherein each of said conductors is copper.

10. A semiconductor package in accordance with claim 1, wherein said ground plane conductors are terminated on a single connection pad on said source area.

11. A semiconductor package in accordance with claim 6, further comprising first, second, third and fourth sets of multiple bond wires each having first and second ends; wherein said first ends of said first and second sets of bond wires are connected, respectively, to said ground plane conductor metalization pads which are adjacent to said gate signal carrying conductor; wherein said first ends of said third and fourth sets of bond wires are connected, respectively, to said ground plane conductor metalization pads which are adjacent to said drain signal carrying conductor; and wherein said second ends of said first, second, third and fourth sets of bond wires converge toward each other and are connected to said connection pad on said source area.

12. A semiconductor package in accordance with claim 1, wherein all said conductors are non-ferrous, non-magnetic materials.

13. A circuitry package comprising:
    (a) a power MOSFET semiconductor package in accordance with claim 1;
    (b) a printed circuit board;
    (c) a heat sink;
    wherein said semiconductor package is positioned on said heat sink in a manner such that said ceramic substrate is in thermal contact with said heat sink; wherein said conductors are operably connected to said printed circuit board; and wherein said semiconductor package is secured to said heat sink.

14. A circuitry package in accordance with claim 13, wherein each said ground plane conductor includes a metalization pad disposed on said ceramic substrate; and said gate signal carrying conductor and said drain signal carrying conductor project outwardly from opposite side edges of said substrate; wherein there are four said ground plane conductors; wherein two of said ground plane conductors are disposed on opposite sides of and spaced from said gate signal carrying conductor an equal distance, and wherein the other two of said ground plane conductors are disposed on opposite sides of and spaced from said drain signal carrying conductor an equal distance.

15. A circuitry package in accordance with claim 14, wherein all said conductors are non-ferrous, non-magnetic materials; wherein each said conductor includes a stress relief bend; and wherein said ceramic substrate includes a bottom surface which is polished to facilitate thermal contact with said heat sink.

* * * * *